United States Patent
Lee et al.

(10) Patent No.: US 9,460,939 B2
(45) Date of Patent: Oct. 4, 2016

(54) PACKAGE-ON-PACKAGE STRUCTURES AND METHODS OF MANUFACTURE THEREOF

(71) Applicant: Taiwan Semiconductor Manufacturing Company, Ltd., Hsin-Chu (TW)

(72) Inventors: Pei-Hsuan Lee, Tainan (TW); Chien Ling Hwang, Hsin Chu (TW); Chung-Shi Liu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

(21) Appl. No.: 14/554,780

(22) Filed: Nov. 26, 2014

(65) Prior Publication Data

US 2016/0148820 A1    May 26, 2016

(51) Int. Cl.
*H01L 21/56* (2006.01)
*H01L 25/00* (2006.01)
*H01L 25/065* (2006.01)
*H01L 21/67* (2006.01)
*H01L 21/683* (2006.01)

(52) U.S. Cl.
CPC ....... *H01L 21/563* (2013.01); *H01L 21/67103* (2013.01); *H01L 21/67126* (2013.01); *H01L 21/6838* (2013.01); *H01L 25/0657* (2013.01); *H01L 25/50* (2013.01)

(58) Field of Classification Search
CPC ... B25B 27/00; B25B 27/0035; B25B 27/06; B25B 27/062; Y10T 29/53957
USPC ........................................................ 29/281.1
See application file for complete search history.

(56) References Cited

U.S. PATENT DOCUMENTS

| | | |
|---|---|---|
| 2002/0185748 A1 | 12/2002 | Akram et al. |
| 2005/0253281 A1 | 11/2005 | Odegard et al. |
| 2008/0216917 A1 | 9/2008 | Takeuchi |
| 2013/0193612 A1 | 8/2013 | Watabe |

*Primary Examiner* — Lee D Wilson
(74) *Attorney, Agent, or Firm* — Slater Matsil, LLP

(57) ABSTRACT

A method for manufacturing a package-on-package structure may include: providing a support structure having a package attached to an inclined surface of the support structure, the package comprising: a first chip package; a second chip package disposed over the first chip package; and a standoff gap between the first chip package and the second chip package, wherein a first side of the package is disposed higher on the inclined surface of the support structure than a second side of the package; and dispensing an underfill into the standoff gap, the underfill flowing through the standoff gap from the first side of the package to the second side of the package.

20 Claims, 17 Drawing Sheets

PACKAGE-ON-PACKAGE STRUCTURES AND METHODS OF MANUFACTURE THEREOF

PRIORITY CLAIM AND CROSS-REFERENCE

This application is related to U.S. patent application Ser. No. 14/472,785, filed on Aug. 29, 2014, entitled "Chip Packages and Methods of Manufacture Thereof," which application is hereby incorporated herein by reference.

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required. An additional limit comes from the significant increase in the number and length of interconnections between devices as the number of devices increases. When the number and length of interconnections increase, both circuit RC delay and power consumption increase.

Three-dimensional (3D) integrated circuits (ICs) help to resolve the above-discussed limitations. Technologies in 3D IC include wafer-on-wafer, die-on-wafer, die-on-die, and package-on-package. In a typical formation process of a package-on-package structure, two or more IC packages are stacked atop each other with an electrical and communication interface to route signals between them. This allows higher component density in devices, such as mobile phones, personal digital assistants (PDA), and digital cameras.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
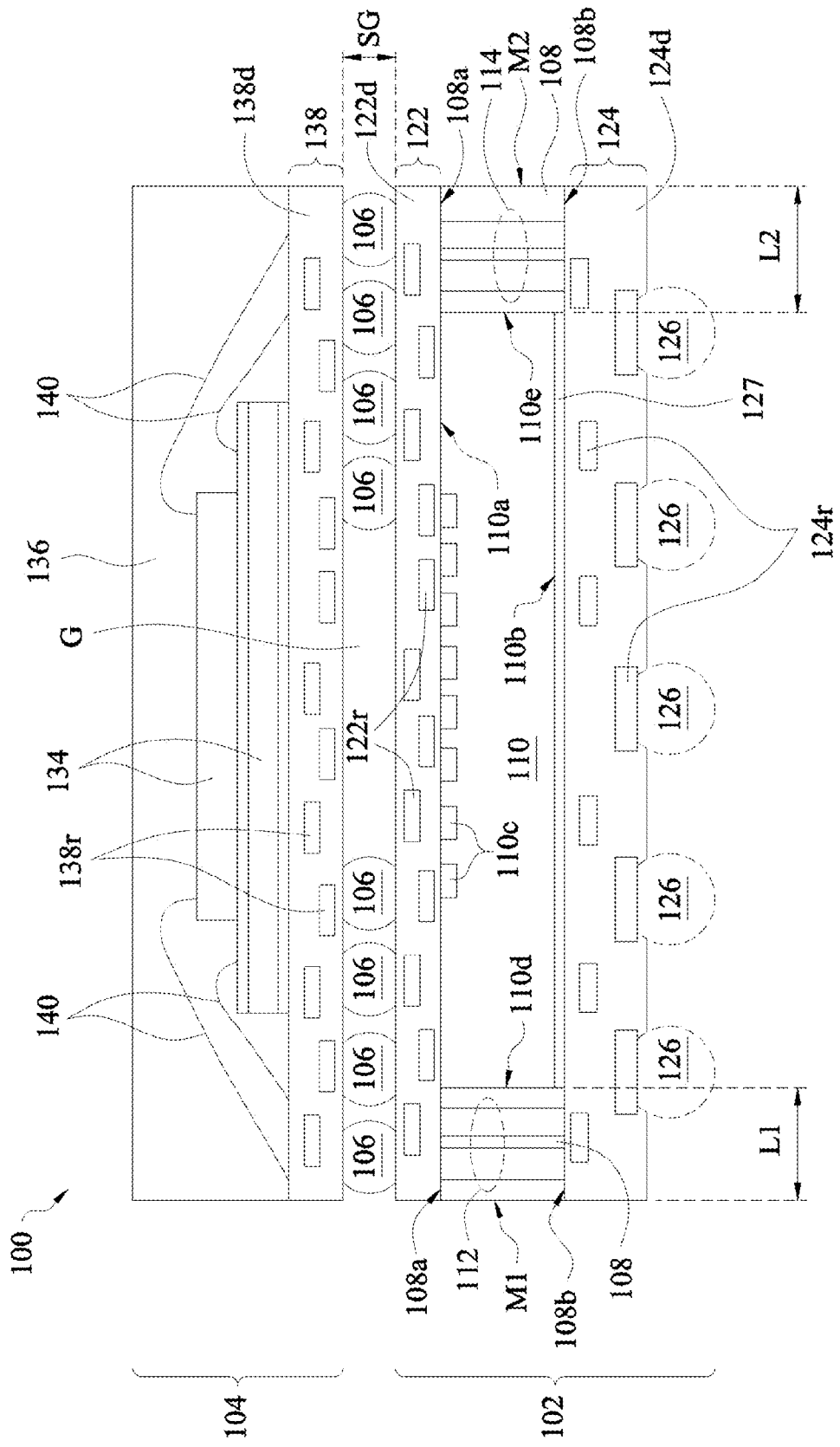
FIGS. 1 and 2 show package-on-package structures, in accordance with some embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a package 100, in accordance with one or more embodiments. The package 100 may include a first chip package 102 and a second chip package 104 disposed over the first chip package 102. In an embodiment, the package 100 may be a package-on-package (PoP) arrangement. For example, the PoP arrangement may be an integrated fan-out (InFO) PoP arrangement.

The package 100 may include a first plurality of connectors 106 disposed between the first chip package 102 and the second chip package 104. The first plurality of connectors 106 may electrically couple or electrically connect the first chip package 102 and the second chip package 104 to each other. Only eight connectors 106 are shown as an example, however, the number of connectors 106 may be less than eight (e.g. one, two, three, four, five, six, or seven) or may be more than eight (e.g. nine, ten, eleven, or more), in accordance with some embodiments. In the example shown in FIG. 1, each of the first plurality of connectors 106 has a spherical shape (e.g. a ball). However, in another embodiment, the first plurality of connectors 106 may have another shape, e.g. pillars, posts, bumps, or caps. In an embodiment, the first plurality of connectors 106 may include controlled collapse chip connection (C4) bumps and/or micro bumps. In another embodiment, the first plurality of connectors 106 may include a ball grid array (BGA). In such an embodiment, the first plurality of connectors 106 may be referred to as a top-side BGA. The first plurality of connectors 106 may include an electrically conductive material (e.g. a metal or metal alloy). For example, the first plurality of connectors 106 may include a solder material. By way of another example, the first plurality of connectors 106 may include at least one of tin, lead, copper, gold, silver, zinc, bismuth, magnesium, antimony, indium or an alloy thereof.

The first chip package 102 may include a molding compound 108 having a first surface 108a and a second surface 108b opposite the first surface 108a. The first surface 108a of the molding compound 108 may face the second chip package 104, and may be referred to as a front-side of the molding compound 108. The second surface 108b of the molding compound 108 may face away from the second chip package 104, and may be referred to as a back-side of the molding compound 108. The molding compound 108 may include an insulating material, which may, for example, include at least one of an epoxy material, a polyurethane material or an epoxy blend including two or more epoxy materials. For example, the molding compound 108 may include epoxy, polyimide, benzocyclobutene (BCB), polybenzoxazole (PBO), and the like. The molding compound 108 may be filled with filler particles, such as silica filler, glass filler or similar fillers.

The first chip package 102 may include a first die 110, which may be at least partially encapsulated by the molding compound 108. Only one first die 110 is shown as an example, however, the number of first dies 110 in the first chip package 102 may be more than one (e.g. two, three, four, or more), in some embodiments. For example, in an embodiment where the first chip package 102 includes a plurality of first dies 110, some of the plurality of the first dies 110 may be arranged laterally adjacent to each other and/or some of the plurality of first dies 110 may be stacked atop each other. In such embodiments, the molding compound 108 may still at least partially encapsulate the plurality of first dies 110. The first die 110 may be a die that may have been singulated from a wafer including a plurality of dies. The first die 110 may be used in one or more applications. For example, in an embodiment, the first die 110 may be used in microelectromechanical systems (MEMS), logic, memory, power, analog or RF communications applications, although other applications may be possible as well in accordance with other embodiments. As an example, in a logic and memory application, the first die 110 may include a logic chip.

The first die 110 may have a first surface 110a and a second surface 110b opposite the first surface 110a. The first surface 110a of the first die 110 may be an active surface of the first die 110. In the example shown in FIG. 1, the first surface 110a of the first die 110 faces the second chip package 104. However, in another embodiment, the first surface 110a of the first die 110 may face away from the second chip package 104, and the second surface 110b of the first die 110 may instead face the second chip package 104.

The first die 110 may include a plurality of contact pads 110c formed at the first surface 110a. In the example of FIG. 1, the plurality of contact pads 110c are shown as being co-planar with the first surface 110a of the first die 110. However, in another embodiment, the plurality of contact pads 110c may be disposed atop the first surface 110a of the first die 110. Only eight contact pads 110c are shown as an example, however, the number of contact pads 110c may be less than eight (e.g. one, two, three, four, five, six, or seven) or may be more than eight (e.g. nine, ten, or more), in accordance with some embodiments. The plurality of contact pads 110c may include an electrically conductive material (e.g. including copper or an alloy thereof). Methods of forming contact pads on a surface of a die are known in the art and are not described here for the sake of brevity.

The first die 110 may include passivation layers, dielectric layers, and under bump metallization (UBM) layers disposed at (e.g. disposed on or over) the first surface 110a of the first die 110. These features of the first die 110 are not shown in FIG. 1 for the sake of simplicity. The passivation layers, dielectric layers, and UBM layers may, for example, be disposed over at least a portion of the first surface 110a and the plurality of contact pads 110c of the first die 110.

As shown in FIG. 1, the first die 110 may be disposed within the molding compound 108. For example, as described above, the molding compound 108 may at least partially encapsulate the first die 110. In other words, the molding compound 108 may encompass or encircle the first die 110 at one or more sides or surfaces of the first die 110. As an example, in the embodiment of FIG. 1, the molding compound 108 may surround and may be in contact with (e.g. direct physical contact with) a first sidewall 110d of the first die 110 and a second sidewall 110e of the first die 110 opposite the first sidewall 110d.

The first chip package 102 may include a first substrate 122 disposed at (e.g. disposed on or over) the first surface 108a of the molding compound 108. The first substrate 122 may additionally be disposed at (e.g. disposed on or over) the surface of the first die 110 facing the second chip package 104, which in the example of FIG. 1, is the first surface 110a of the first die 110. The first substrate 122 may be referred to as a front-side substrate. As shown in FIG. 1, the first substrate 122 may be disposed between the first die 110 and the first plurality of connectors 106. Additionally, the first substrate 122 may be disposed between the molding compound 108 (e.g. the first surface 108a) of the molding compound 108 and the first plurality of connectors 106. In other words, the first substrate 122 may cover the first die 110 and the molding compound 108. The first substrate 122 may include conductive structures 122r (e.g. RDLs and/or UBMs) that may be partially or fully disposed within an insulating layer 122d (e.g. a dielectric layer). The conductive structures 122r of the first substrate 122 may be electrically coupled or electrically connected to the plurality of contact pads 110c of the first die 110 and to the first plurality of connectors 106. Consequently, the conductive structures 122r of the first substrate 122 may redistribute and/or re-map electrical connections between the plurality of contact pads 110c of the first die 110 and the first plurality of connectors 106. The conductive structures 122r may include similar materials as the plurality of contact pads 110c of the first die 110.

The first chip package 102 may further include a second substrate 124 disposed at the second surface 108b of the molding compound 108. The second substrate 124 may additionally be disposed at or near the surface of the first die 110 facing away from the second chip package 104, which in the example of FIG. 1, is the second surface 110b of the first die 110. The first die 110 may be attached or secured to the second substrate 124 by an adhesive layer 127. In other words, the adhesive layer 127 may be disposed between the second substrate 124 and the first die 110, as shown in FIG. 1. The adhesive layer 127 may include glue, a polymer material, a die attach film (DAF), and the like.

The second substrate 124 may be referred to as a backside substrate. In an embodiment, the second substrate 124 may include conductive structures 124r (e.g. RDLs and/or UBMs) that may be partially or fully disposed within an insulating layer 124d (e.g. a dielectric layer). The conductive structures 124r may include similar materials as the plurality of contact pads 110c of the first die 110. However, in another embodiment, the second substrate 124 may include a semiconductor substrate. The semiconductor substrate may include an elementary semiconductor (e.g. including silicon and/or germanium in crystal), a compound semiconductor (e.g. including at least one of silicon carbide, gallium arsenic, gallium phosphide, indium phosphide, indium arsenide, or indium antimonide), an alloy semiconductor (e.g. including at least one of SiGe, GaAsP, AlInAs, AlGaAs, GaInAs, GaInP, or GaInAsP), or combinations thereof. By way of yet another example, the second substrate 124 may include FR4 and/or bis-maleimidetriazine (BT). In such an example, the second substrate 124 may include spin coated dielectric materials and RDLs and/or organic substrate with lamination of copper foils, dielectric film on a BT and/or FR4 core.

The first chip package 102 may include a first via structure 112 disposed within the molding compound 108 at a first lateral portion L1 of the first chip package 102. The first lateral portion L1 of the first chip package 102 may be a first peripheral portion of the first chip package 102, and may be a region of the first chip package 102 disposed between the first sidewall 110d of the first die 110 and a first lateral extent M1 of the molding compound 108. In other words, the first via structure 112 may be disposed in the molding compound 108, laterally adjacent to and spaced apart from the first sidewall 110d of the first die 110. The first via structure 112 may extend between the first surface 108a and the second surface 108b of the molding compound 108. Only two first via structures 112 are shown as an example, however, the number of first via structures 112 at the first lateral portion L1 of the first chip package 102 may be less than two (e.g. one) or may be more than two (e.g. three, four, or more), in accordance with some embodiments. The first via structure 112 may be electrically coupled or electrically connected to the conductive structures 122r of the first substrate 122 and to the conductive structures 124r of the second substrate 124, thereby electrically connecting the first substrate 122 and the second substrate 124 to each other. The first via structure 112 may include similar materials as the plurality of contact pads 110c.

The first chip package 102 may include a second via structure 114 within the molding compound 108 at a second lateral portion L2 of the first chip package 102. The second lateral portion L2 of the first chip package 102 may be a second peripheral portion of the first chip package 102, and may be a region of the first chip package 102 that may be disposed between the second sidewall 110e of the first die 110 and a second lateral extent M2 of the molding compound 108 opposite the first lateral extent M1. In other words, the second via structure 114 may be disposed in the molding compound 108, laterally adjacent to and spaced apart from the second sidewall 110e of the first die 110. The second via structure 114 may extend between the first surface 108a and the second surface 108b of the molding compound 108. Only two second via structures 114 are shown as an example, however, the number of second via structures 114 at the second lateral portion L2 of the first chip package 102 may be less than two (e.g. one) or may be more than two (e.g. three, four, or more), in accordance with some embodiments. The second via structure 114 may be electrically coupled or electrically connected to the conductive structures 122r of the first substrate 122 and to the conductive structures 124r of the second substrate 124, thereby electrically connecting the first substrate 122 and the second substrate 124 to each other. The second via structure 114 may include similar materials as the plurality of contact pads 110c.

The first chip package 102 may include a second plurality of connectors 126 disposed at a side or surface of the second substrate 124 facing away from the first die 110. The second plurality of connectors 126 may be electrically coupled or electrically connected to the conductive structures 124r of the second substrate 124. The second plurality of connectors 126 may be used to connect the package 100 to a customer board, a printed circuit board, or an interposer board that may, for example, be used in an end-user application. Only five connectors 126 are shown as an example, however, the number of connectors 126 may be less than five (e.g. one, two, three, or four) or may be more than five (e.g. six, seven, or more), in accordance with some embodiments. In the example shown in FIG. 1, the each of the second plurality of connectors 126 has a spherical shape (e.g. a ball). However, in another embodiment the second plurality of connectors 126 may have another shape, e.g. pillars, posts, bumps, or caps. In an embodiment, the second plurality of connectors 126 may include a ball grid array (BGA). In such an embodiment, the second plurality of connectors 126 may be referred to as a back-side BGA. The second plurality of connectors 126 may include similar materials as the first plurality of connectors 106.

As a result of the electrical couplings and electrical connections described above, the first plurality of connectors 106 may be electrically coupled or electrically connected to the first die 110 through the conductive structures 122r of the first substrate 122 and the plurality of contact pads 110c. In other words, an electrical path between the first plurality of connectors 106 and the first die 110 may include the conductive structures 122r of the first substrate 122 and the plurality of contact pads 110c. Furthermore, the first plurality of connectors 106 may be electrically coupled or electrically connected to the second plurality of connectors 126 through the conductive structures 122r of the first substrate 122, the first and second via structures 112 and 114, and the conductive structures 124r of the second substrate 124. In other words, an electrical path between the first plurality of connectors 106 and the second plurality of connectors 126 may include the conductive structures 122r of the first substrate 122, the first and second via structures 112 and 114, and the conductive structures 124r of the second substrate 124. Even further, the first die 110 may be electrically coupled or electrically connected to the second plurality of connectors 126 through the plurality of contact pads 110c, the conductive structures 122r of the first substrate 122, the first and second via structures 112 and 114, and the conductive structures 124r of the second substrate 124. In other words, an electrical path between the first die 110 and the second plurality of connectors 126 may include the plurality of contact pads 110c, the conductive structures 122r of the first substrate 122, the first and second via structures 112 and 114, and the conductive structures 124r of the second substrate 124.

The package 100 may include the second chip package 104, which may be disposed over the first chip package 102. The second chip package 104 may include at least one third die 134. Only two dies 134 are shown as an example, however, the number of dies 134 may be less than two (e.g. one) or may be more than two (e.g. three, four, five, or more), in accordance with some embodiments. The at least one third die 134 may be a die that may have been singulated from a wafer including a plurality of dies. The at least one third die 134 may be used in one or more applications. For example, in an embodiment, the at least one third die 134 may be used in microelectromechanical systems (MEMS), logic, memory, analog, power or RF communications applications, although other applications may be possible as well in accordance with other embodiments. As an example, in a logic and memory application, the at least one third die 134 may include a memory chip, examples of which include a dynamic random access memory chip, a wide I/O DRAM chip, a flash memory chip, a hybrid of (e.g. a combination of) a low power double data rate (LPDDR) chip and a flash memory chip, a LPDDR memory 3/4 die, and the like. In an example of such an embodiment, the second chip package 104 may be an LPDDR 3/4 package, a wide I/O chip or a wide I/O chip package. As a further example, the at least one third die 134 may be a die that can provide RF connectivity, e.g. to the first chip package 102.

The second chip package 104 may include a third substrate 138 including conductive structures 138r (e.g. RDLs and/or UBMs) that may be partially or fully disposed within an insulating layer 138d (e.g. a dielectric layer). The at least one third die 134 may be encapsulated in an encapsulant 136 and may be electrically connected or electrically coupled to the conductive structures 138r of the third substrate 138 by a third plurality of connectors 140. The encapsulant 136 may include similar materials as the molding compound 108. In the embodiment shown in FIG. 1, the third plurality of connectors 140 may be wirebond connections that electrically connect the at least one third die 134 to the conductive structures 138r of the third substrate 138. However, in another embodiment, the third plurality of connectors 140 may be other types of connectors (e.g. flip chip bumps, RDLs, via structures, and the like).

As a result of the electrical couplings and electrical connections described above, the at least one third die 134 may be electrically coupled or electrically connected to the first plurality of connectors 106 through the third plurality of connectors 140 and the conductive structures 138r of the third substrate 138. In other words, an electrical path between the at least one third die 134 and the first plurality of connectors 106 may include the third plurality of connectors 140 and the conductive structures 138r of the third substrate 138.

Figure 2:
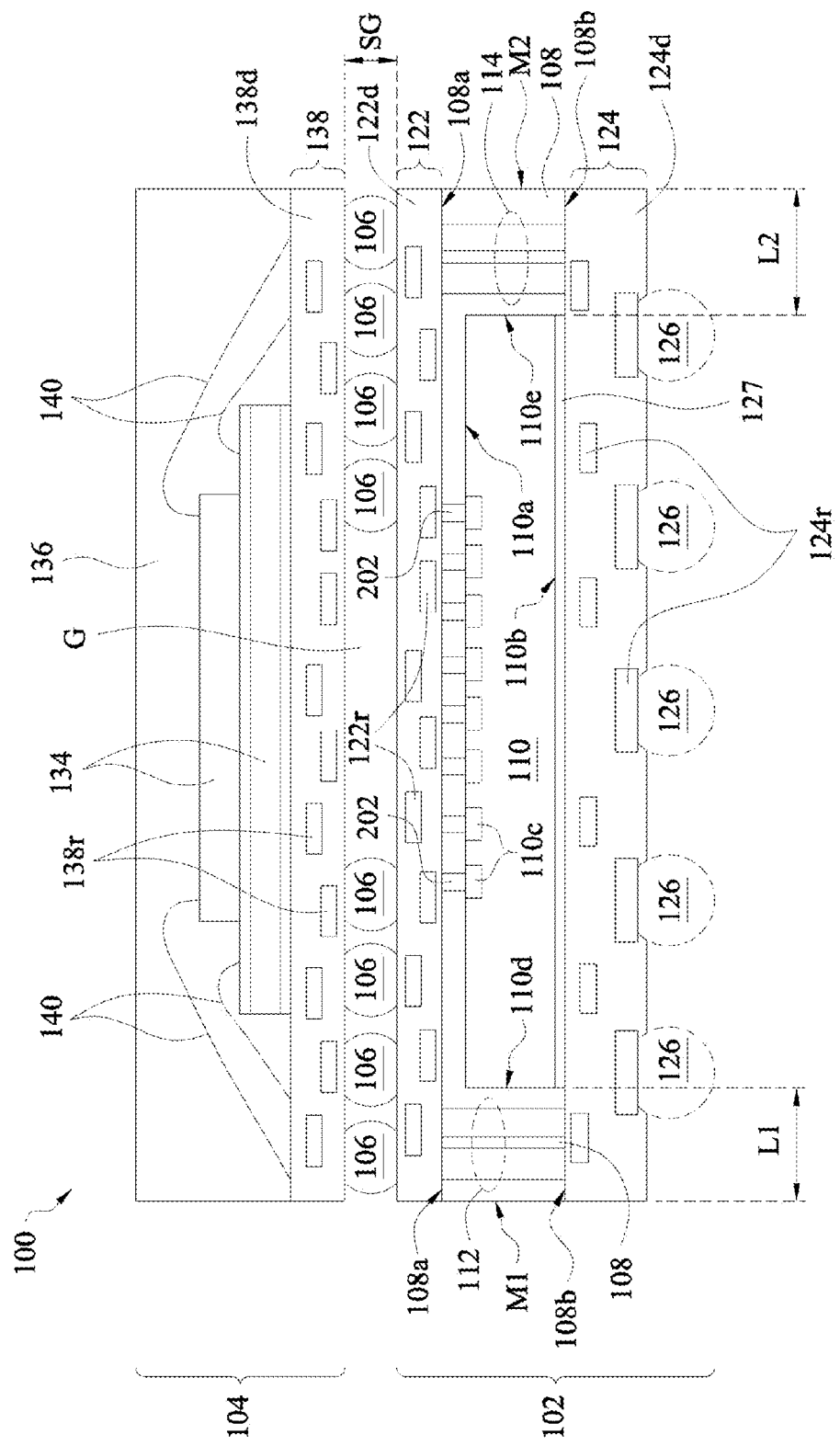

In the embodiment shown in FIG. 1, the first surface 108a of the molding compound 108 is substantially co-planar with the first surface 110a of the first die 110. However, FIG. 2 shows another embodiment of the package 100 in which the molding compound 108 covers at least a portion of the first surface 110a of the first die 110. Consequently, in the embodiment shown in FIG. 2, the first die 110 may be encapsulated by the molding compound 108 on the first surface 110a of the first die 110 and by the molding compound 108 at the first and second sidewalls 110d and 110e of the first die 110. This arrangement shown in FIG. 2 may provide the first die 110 with more protection (e.g. physical protection) compared to the arrangement shown in FIG. 1. In the embodiment of FIG. 2, the plurality of contact pads 110c of the first die 110 may be electrically connected or electrically coupled to the conductive structures 122r of the first substrate 122 by a fourth plurality of connectors 202, which may be disposed in the molding compound 108 between the first surface 110a of the first die 110 and the first substrate 122. Although each of the fourth plurality of connectors 202 is shown as a via (e.g. a through-molding via) in the example of FIG. 2, the fourth plurality of connectors 202 may alternatively, or additionally, include other types of connectors (e.g. bumps, RDLs, and the like).

In the embodiments shown in FIG. 1 and FIG. 2, the package 100 includes one second chip package 104 disposed over (e.g. stacked over) the first chip package 102. However, in other embodiments, there may be a plurality of second chip packages 104 that may be disposed over (e.g. stacked over) the first chip package 102. As an example, the package 100 may include a plurality of second chip packages 104 stacked atop each other and further disposed over (e.g. stacked over) the first chip package 102.

As shown in FIGS. 1 and 2, the package 100 may have a standoff gap SG disposed between the first chip package 102 and the second chip package 104. In other words, the first chip package 102 and the second chip package 104 may be separated from each other by a distance, which is represented in FIGS. 1 and 2 as the standoff gap SG. As an example, the surface of the first substrate 122 facing the second chip package 104 and the surface of the third substrate 138 facing the first chip package 102 may be separated by the standoff gap SG. In an embodiment, the standoff gap SG may be in a range from about 100 micrometers to about 300 micrometers (e.g. about 200 micrometers), although other distances may be possible as well. As shown in the examples of FIG. 1 and FIG. 2, the first plurality of connectors 106 may be disposed within the standoff gap SG.

Also shown in FIGS. 1 and 2 is an air gap G disposed in the standoff gap SG. In the embodiments of FIGS. 1 and 2, the air gap G may be a region between the first chip package 102 and the second chip package 104 that is devoid of the first plurality of connectors 106. In some embodiments, the package 100 may include a chip (not shown in FIGS. 1 and 2) disposed within the air gap G and electrically connected to the conductive structures 122r of the first substrate 122. Consequently, in some embodiments, the standoff gap SG may be able to accommodate a chip in the air gap G. It is further noted that in some embodiments of the package 100, there may not be an air gap G disposed in the standoff gap SG. In such embodiments, the entire standoff gap SG may be populated by the first plurality of connectors 106.

The package 100 may be subjected to further processing steps. For example, the package 100 may be attached or electrically connected to a customer board via the second plurality of connectors 126, e.g. by a reflow process or a thermo-compression bonding process. However, these further processing steps can exert thermal and/or mechanical stresses on the package 100 or on features thereof. As an example, the first plurality of connectors 106 of the package 100 may provide mechanical and electrical coupling between the first chip package 102 and the second chip package 104. However, when further processing steps are performed on the package 100, the first plurality of connectors 106 may be subjected to thermal and/or mechanical stresses, thus adversely affecting the coupling between the first chip package 102 and the second chip package 104. Consequently, it may be desirable to improve the strength of the coupling between the first chip package 102 and the second chip package 104 and/or to protect the first plurality of connectors 106 from thermal and/or mechanical stresses prior to performing these further processing steps. This may be effected by at least partially filling the standoff gap SG with an underfill that may encapsulate some or all of the first plurality of connectors 106 before performing further processing steps on the package 100. In other words, the underfill may be formed in the standoff gap SG at a component-level and further processing steps may be performed on the package 100 thereafter.

However, as seen in FIGS. 1 and 2 and as described above, the standoff gap SG may be narrow (e.g. about 200 micrometers) and the widths of the first chip package 102 and the second chip package 104 may be substantially equal. Consequently, it may be difficult to dispense the underfill in the standoff gap SG while ensuring that other features of the package 100 are substantially free from the dispensed underfill. For example, in dispensing the underfill in the standoff gap SG, surfaces of the second plurality of connectors 126 and/or surfaces of the first and second lateral extents M1 and M2 of the molding compound 108 may inadvertently be covered or contaminated with the underfill. This may lead to further processing steps that may need to be performed in order to remove the underfill from these surfaces of the package 100. Consequently, it may be necessary to provide a method of forming the underfill in the standoff gap SG at the component-level to at least partially encapsulate the first plurality of connectors 106 so as to improve the strength of the coupling between the first chip package 102 and the second chip package 104 and to protect the first plurality of connectors 106 from thermal and/or mechanical stresses, while ensuring that other features of the package 100 are substantially free from the underfill that is formed in the standoff gap SG.

Figure 3A:
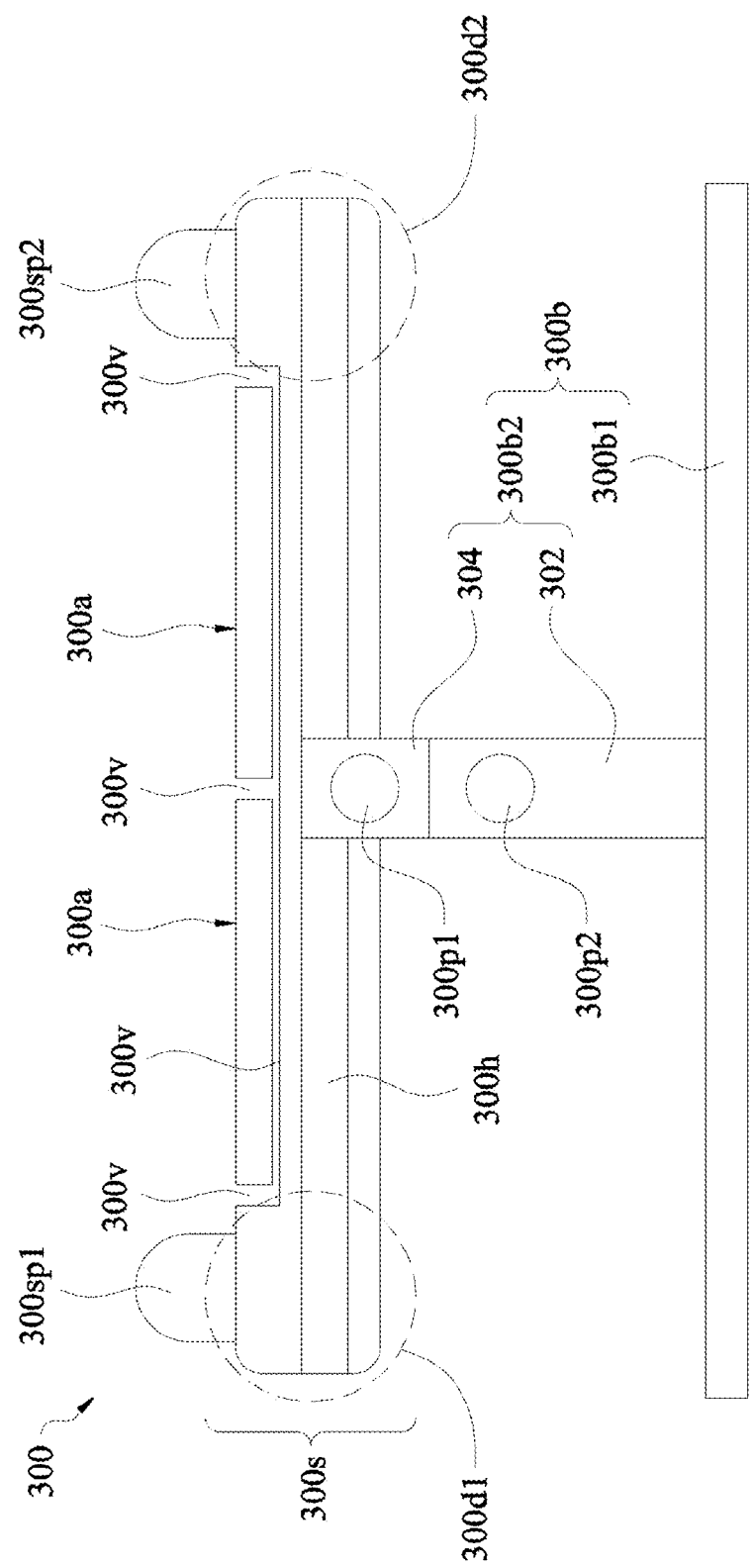
FIGS. 3A to 3C show cross-sectional views of a movable support structure, in accordance with some embodiments.
Figure 3B:
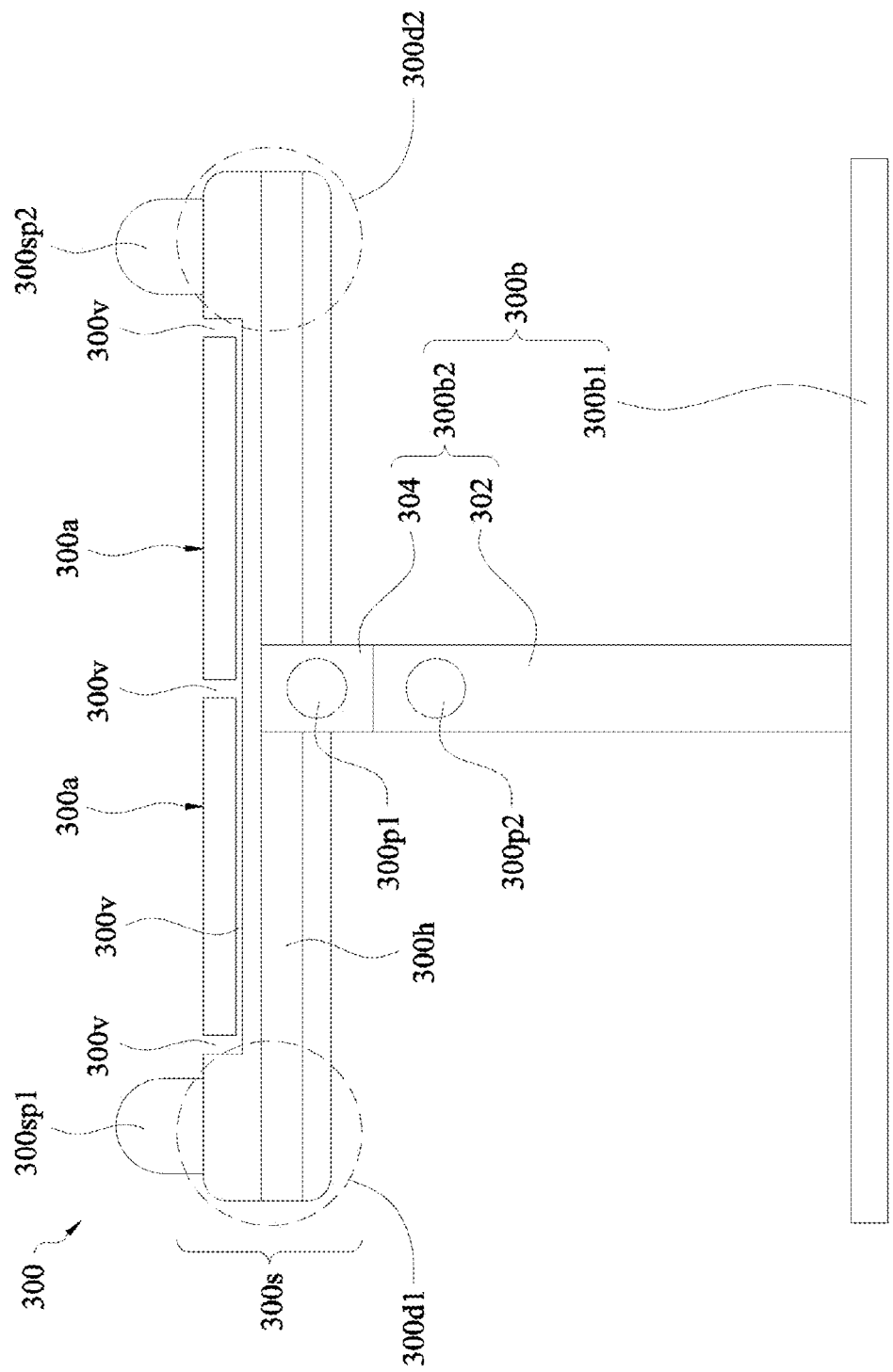
Figure 3C:
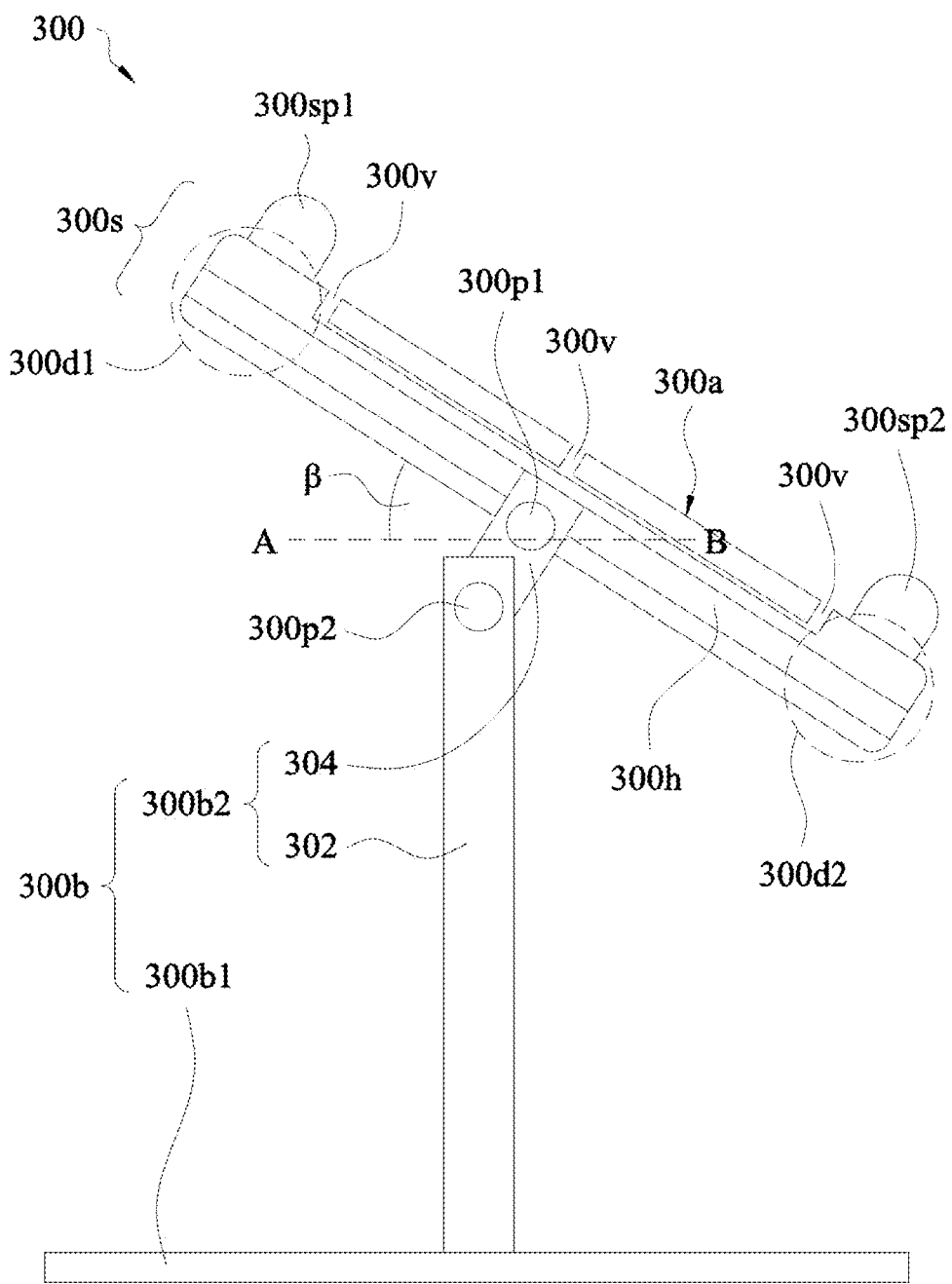

FIGS. 3A to 3C show cross-sectional views of a movable support structure 300, in accordance with one or more embodiments. The movable support structure 300 may be used in cooperation with an underfill dispenser to form the underfill in the standoff gap SG at the component-level while ensuring that other features of the package 100 are substantially free from the underfill, thereby at least partially encapsulating the first plurality of connectors 106 prior to performing further processing steps on the package 100. As an example, the package 100 may be attached to a surface of the movable support structure 300 and the surface of the movable support structure having the package attached thereto may be tilted. Thereafter, the underfill may be dispensed or jetted or released into (e.g. directly into) the standoff gap SG. In other words, the package 100 is attached to the movable support structure 300 and moved such that the underfill is efficiently dispensed in the space between the first chip package 102 and the second chip package 104, thereby filling the standoff gap SG, at least partially encapsulating the first plurality of connectors 106, and ensuring that other features of the package 100 are substantially free from the underfill. These steps are described in greater detail in the process flow shown in FIGS. 4A to 4D.

As shown in FIG. 3A, the movable support structure 300 may include a base 300b and a stage 300s pivotably connected to the base 300b. The base 300b may include a first portion 300b1 and a second portion 300b2 attached to the first portion 300b1. As shown in FIG. 3A, the second portion 300b2 of the base 300b may extend from the first portion 300b1 of the base 300b to the stage 300s. Stated in another way, the second portion 300b2 of the base 300b may be an arm that extends from the first portion 300b1 of the base 300b and is pivotably connected to the stage 300s of the movable support structure 300. The second portion 300b2 of the base 300b may be extendable (e.g. an extendable arm) and may include one or more segments. For example, as shown in FIG. 3A, the second portion 300b2 of the base 300b may include a first segment 302 proximal the first portion 300b1 of the base 300b and a second segment 304 proximal the stage 300s.

The movable support structure 300 may include a first pivot 300p1 that connects (e.g. pivotably connects) the base 300b and the stage 300s to each other. For example, in the embodiment of FIG. 3A, the first pivot 300p1 connects the second portion 300b2 of the base 300b and the stage 300s to each other. In the example of FIG. 3A, first pivot 300p1 is disposed in the second segment 304 of the second portion 300b2 of the base 300b. The movable support structure 300 may additionally include a second pivot 300p2 disposed below the first pivot 300p1. For example, the second pivot 300p2 may be disposed in the first segment 302 of the second portion 300b2 of the base 300b. The second pivot 300p2 may be an element of the movable support structure 300 about which the stage 300s and the second segment 304 of the second portion 300b2 of the base 300b pivotably rotates. This feature of the movable support structure 300 is illustrated in greater detail in FIG. 3C.

The stage 300s of the movable support structure 300 may have a surface 300a upon which the package 100 is subsequently placed. The surface 300a of the stage 300s may face away from the base 300b of the movable support structure 300. The movable support structure 300 may include vacuum channels 300v (e.g. one or more vacuum channels 300v) formed within the stage 300s, as shown in the example of FIG. 3A. The vacuum channels 300v may be used to secure the package 100 to the movable support structure 300 (e.g. to the surface 300a of the stage 300s). For example, The vacuum channels 300v may have openings at the surface 300a of the stage 300s, and the package 100 may held in place on the surface 300a of the stage 300s by a suction force created at the surface 300a. The suction force may be created by applying a low pressure or a vacuum to the vacuum channels 300v using, for example, a pump (not shown in FIG. 3A), which may evacuate air in the vacuum channels 300v.

The movable support structure 300 may include a heating element 300h, which may be disposed in (e.g. within) the stage 300s of the movable support structure 300. The heating element 300h may, for example, be adapted to (e.g. designed and constructed to) heat the underfill that is subsequently dispensed in the standoff gap SG while the package 100 is attached to the surface 300a of the stage 300s.

As shown in FIG. 3A, the movable support structure 300 may include a plurality of stoppers 300sp1 and 300sp2 disposed on the surface 300a of the stage 300s. The plurality of stoppers 300sp1 and 300sp2 may work in cooperation with the vacuum channels 300v of the movable support structure 300 to hold the package 100 in place. However, it is noted that other embodiments of the movable support structure 300 may not include the plurality of stoppers 300sp1 and 300sp2, and the vacuum channels 300v themselves may be sufficient to hold the package 100 in place. In the embodiment shown in FIG. 3A, only two stoppers are shown, however, the number of stoppers may be less than two (e.g. one or none) or may be more than two (e.g. three, four, five, or more), in accordance with some embodiments. In the example of FIG. 3A, the plurality of stoppers 300sp1 and 300sp2 of the movable support structure 300 may include a first stopper 300sp1 disposed at a first lateral portion 300d1 of the stage 300s and a second stopper 300sp2 disposed at a second lateral portion 300d2 of the stage 300s opposite the first lateral portion 300d1. The first and second lateral portions 300d1 and 300d2 of the stage 300s may be regions of the stage 300s between the outermost vacuum channels 300v and edges of the stage 300s.

As shown in FIG. 3B, the stage 300s of the movable support structure 300 may be raised, e.g. by extending the second portion 300b2 of the base 300b. For example, in the embodiment shown in FIG. 3B, the first segment 302 of the second portion 300b2 of the base 300b is extended, thereby raising the stage 300s of the movable support structure 300. This may be effected by a motor (e.g. a stepper motor) or pneumatically. By raising the stage 300s of the movable support structure 300, a clearance between the first portion 300b1 of the base 300b and the stage 300s may be provided, thus allowing the stage 300s to be tilted. It is noted that in some embodiments of the movable support structure 300, the length of the second portion 300b2 of the base 300b may be large enough to already provide sufficient clearance between the first portion 300b1 of the base 300b and the stage 300s in order to tilt the stage 300s. In such embodiments, there may not be a need to raise the stage 300s of the movable support structure 300.

As shown in FIG. 3C, the stage 300s and the second segment 304 of the second portion 300b2 of the base 300b may be rotated about the second pivot 300p2. Consequently, the surface 300a of the stage 300s may be tilted or inclined. An incline angle β subtended between the stage 300s and a horizontal axis A-B may be in a range from about −90 degrees (e.g. when the second lateral portion 300d2 of the stage 300s is tilted higher than the first lateral portion 300d1) to about 90 degrees (e.g. when the first lateral portion 300d1 of the stage 300s is tilted higher than the second lateral portion 300d2), although other angles may be possible as well in accordance with other embodiments. The incline angle β may be controlled mechanically, e.g. by a motor (e.g. a stepper motor). For example, the motor (not shown in FIG. 3C) may be mechanically connected to the second pivot 300p2, and the motor may tilt the stage 300s and the first pivot 300p1 about the second pivot 300p2.

FIGS. 4A to 4D show a process flow illustrating some of the steps of forming an underfill in the standoff gap SG of the package 100, in accordance with one or more embodiments. Although the process flow shown in FIGS. 4A to 4D illustrate forming the underfill in the standoff gap SG of the package 100 shown in FIG. 1, it is noted that the process flow may similarly be applied to the package 100 shown in FIG. 2, as well as to variants of the packages shown in FIGS. 1 and 2.

Figure 4A:
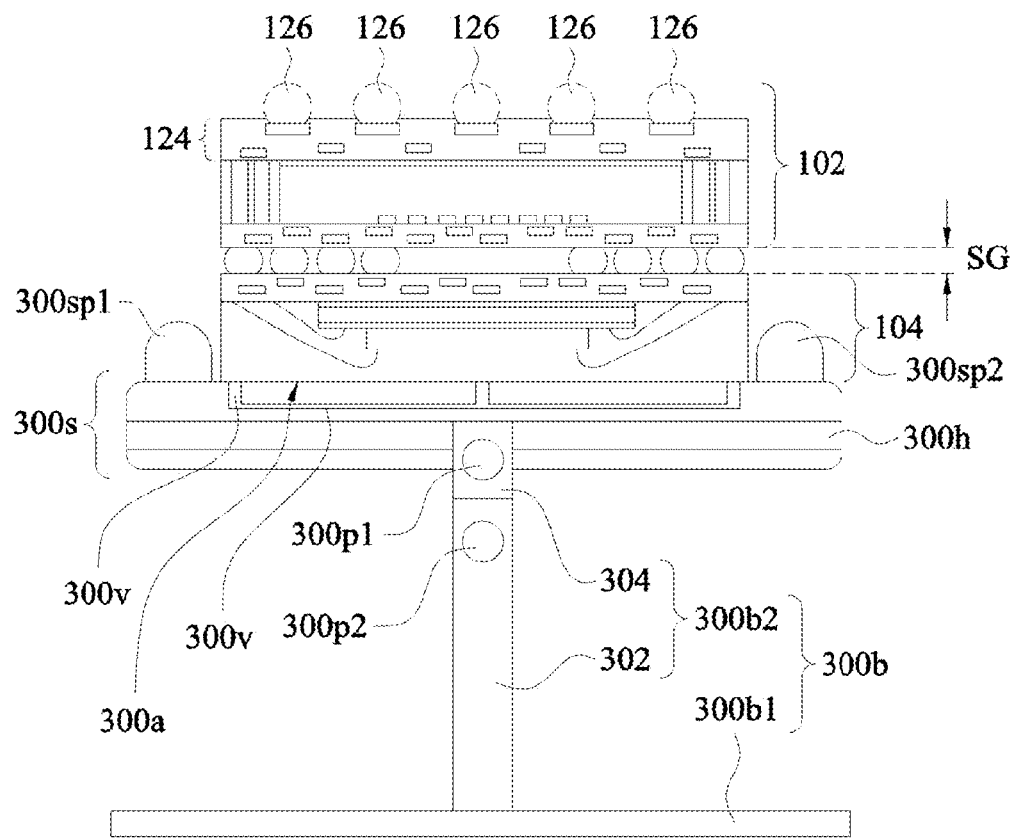
FIGS. 4A to 4E and FIGS. 5A and 5B show process flows illustrating methods of manufacturing package-on-package structures, in accordance with some embodiments.

As shown in FIG. 4A, the package 100 may be disposed over the surface 300a of the stage 300s. For example, the package 100 may be placed on the surface 300a of the stage 300s. In the example shown in FIG. 4A, the package 100 may be placed on the surface 300a while the surface 300a is substantially level or flat (e.g. where the incline angle β is substantially zero). However, in other embodiments, the package 100 may be placed on the surface 300a while the surface 300a is slightly tilted (e.g. having an incline angle β in the range from about −10 degrees to about 10 degrees).

As shown in FIG. 4A, the second chip package 104 of the package 100 may be disposed between the stage 300s of the movable support structure 300 and the first chip package 102. In other words, a surface of the second chip package 104 facing away from the first chip package 102 may face and be in contact with (e.g. direct physical contact with) the surface 300a of the stage 300s. This may be a consequence of the second plurality of connectors 126 being formed at the surface of the second substrate 124 facing away from the second chip package 104, thus excluding the possibility of having the first chip package 102 being disposed between the stage 300s and the second chip package 104. However, in another embodiment where the package 100 is devoid of the second plurality of connectors 126, package 100 may be placed on the surface 300a of the stage 300s such that the first chip package 102 of the package 100 is disposed between the stage 300s of the movable support structure 300 and the second chip package 104.

As shown in FIG. 4A, the first stopper 300sp1 and the second stopper 300sp2 may be disposed at either side of the second chip package 104 (e.g. at opposite sidewalls of the encapsulant 136 of the second chip package 104). In other words, the package 100 may be disposed between the first stopper 300sp1 and the second stopper 300sp2. In an embodiment, the first stopper 300sp1 and/or the second stopper 300sp2 may be in contact with (e.g. direct physical contact with) one or more sides of the second chip package 104 (e.g. one or more sidewalls of the encapsulant 136 of the second chip package 104). As described above, package 100 may be held in place on the surface 300a of the stage 300s by the suction force created at the surface 300a. In the embodiment of FIG. 4A, the first stopper 300sp1 and/or the second stopper 300sp2 may also aid in holding the package 100 in place.

Figure 4B:
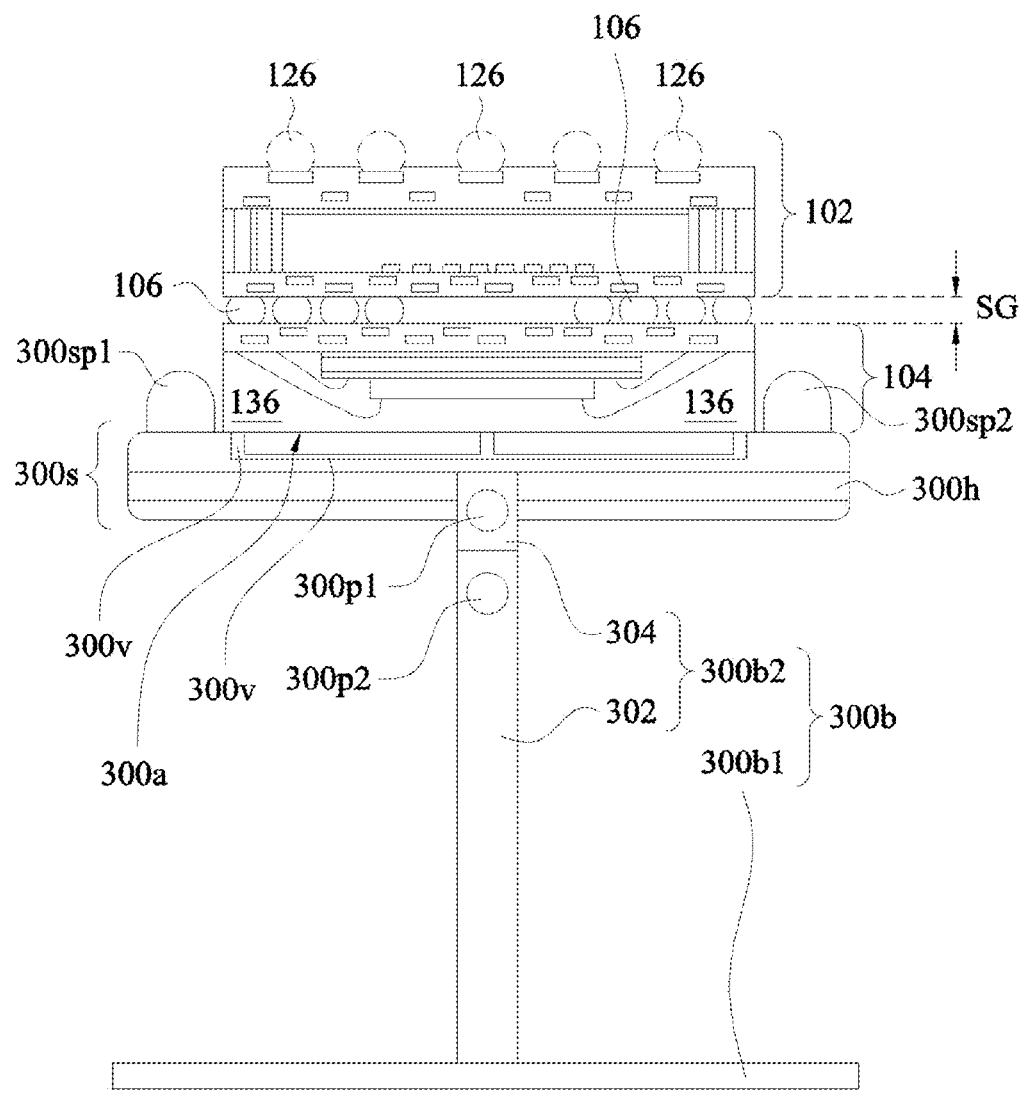

As shown in FIG. 4B, the stage 300s of the movable support structure 300 may be raised, e.g. by extending the first segment 302 of the second portion 300b2 of the base 300b, as described above in FIG. 3B. However, it is once again noted that in some embodiments, the length of the second portion 300b2 of the base 300b may be large enough to already provide sufficient clearance between the first portion 300b1 of the base 300b and the stage 300s in order to tilt the stage 300s. In such embodiments, there may not be a need to raise the stage 300s of the movable support structure 300.

Figure 4C:
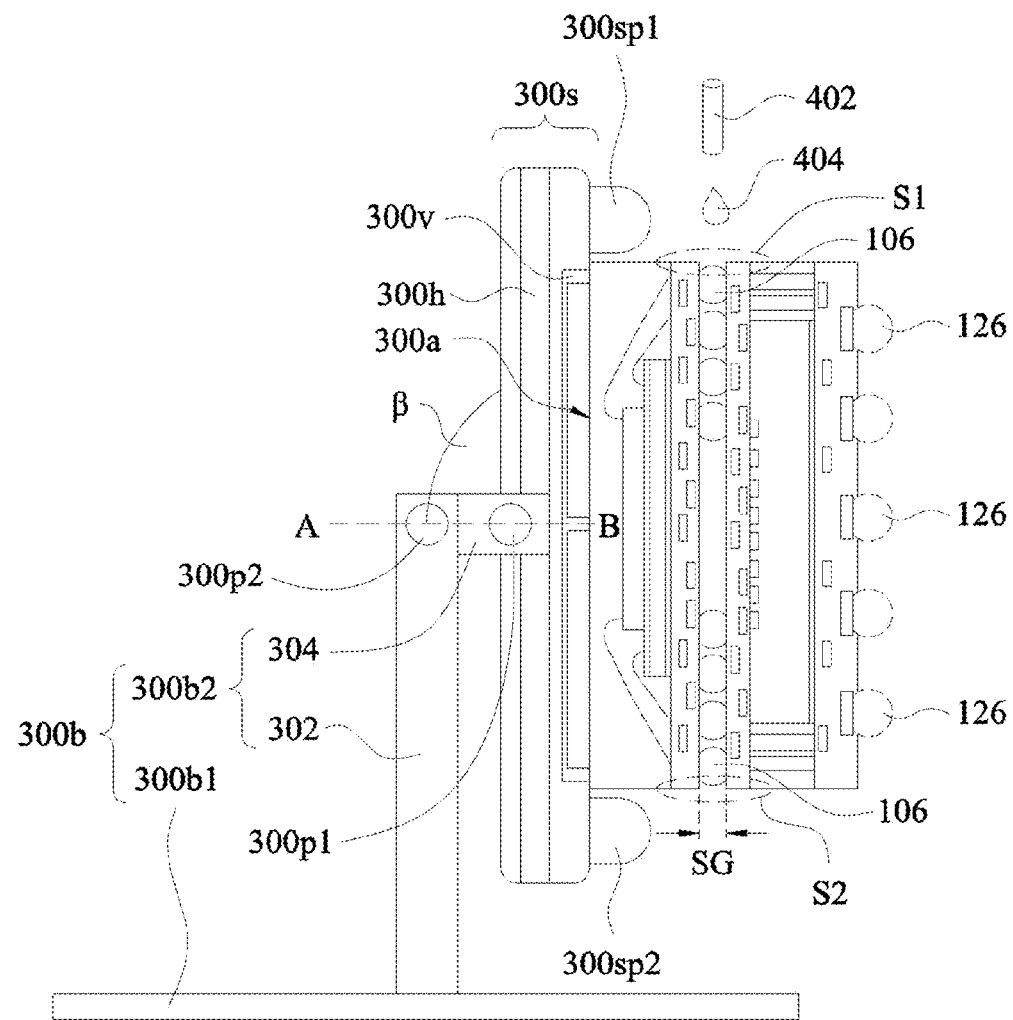

As shown in FIG. 4C, the stage 300s may be tilted. In the example shown in FIG. 4C, the stage 300s having the package 100 attached thereto is tilted to substantially 90 degrees (e.g. the incline angle β may be substantially equal to 90 degrees). However, in another embodiment, the stage 300s may be tilted to have an incline angle β in a range from about 15 degrees to about 90 degrees (e.g. in the range from about 75 degrees to about 90 degrees) or in a range from about −15 degrees to about −90 degrees (e.g. in the range from about −75 degrees to about −90 degrees).

As shown in FIG. 4C, a dispenser head 402 may be positioned over (e.g. substantially vertically above) the standoff gap SG. An underfill 404 may be dispensed or jetted or released from the dispenser head 402 over (e.g. directly over) the first plurality of connectors 106. In other words, the underfill 404 may be dispensed or jetted or released into (e.g. directly into) the standoff gap SG. The underfill 404 may be dispensed in multiple (e.g. two or more) dispense passes. Subsequently, the underfill 404 may flow, under the influence of gravity, through the standoff gap SG from a first side S1 of the package 100 to a second side S2 of the package 100 opposite the first side S1. As shown in FIG. 4C, the first side S1 of the package 100 may be disposed higher on the inclined surface 300a of the stage 300s than the second side S2 of the package 100. In flowing through the standoff gap SG, the underfill 404 may at least partially encapsulate one or more of the first plurality of connectors 106. Furthermore, the heating element 300h may be used to heat the underfill 404 as it flows through the standoff gap SG. In the example shown in FIG. 4C, the underfill 404 may be allowed to flow from the first side S1 of the package 100 until it reaches the second side S2 of the package 100. After the underfill 404 has sufficiently flowed to fill the standoff gap SG, the package 100 may be removed from the movable support structure 300, and the resultant package 100 may resemble the package 100 shown in FIG. 4D. The underfill 404 may include similar materials as the molding compound 108.

An advantage provided by the process flow shown in FIGS. 4A to 4D includes a method of forming the underfill 404 in the standoff gap SG at the component-level (e.g. prior to further processing steps that may be performed on the package 100). The underfill 404 at least partially encapsulates the first plurality of connectors 106, thus improving the strength of the coupling between the first chip package 102 and the second chip package 104 and protecting the first plurality of connectors 106 from thermal and/or mechanical stresses, while ensuring that other features of the package 100 are substantially free from the underfill 404 that is formed in the standoff gap SG.

In the process flow described in FIG. 4A to FIG. 4D, once the stage 300s of the movable support structure 300 is pivotably tilted (e.g. after attaching the package 100 to the stage 300s), the stage 300s remains in position while the underfill 404 is dispensed and while the underfill 404 flows to fill the standoff gap SG. In other words, the incline angle β does not vary during the dispensing and the flowing of the underfill 404. However, in another embodiment, the stage 300s of the movable support structure 300 may be pivotably tilted while the underfill 404 is dispensed and/or while the underfill 404 flows to fill the standoff gap SG. In such an embodiment, the incline angle β may be varied during the dispensing and/or the flowing of the underfill 404. Varying the incline angle β in such a manner may enhance the flowing of the underfill 404 through the standoff gap SG, e.g. in an embodiment where the incline angle β is increased during the dispensing and/or the flowing of the underfill 404. Varying the incline angle β in such a manner may also prevent overflow or bleeding of the underfill 404 past the second side S2 of the package 100, e.g. in an embodiment where the incline angle β is decreased while the underfill 404 flows through the standoff gap SG.

Figure 4D:
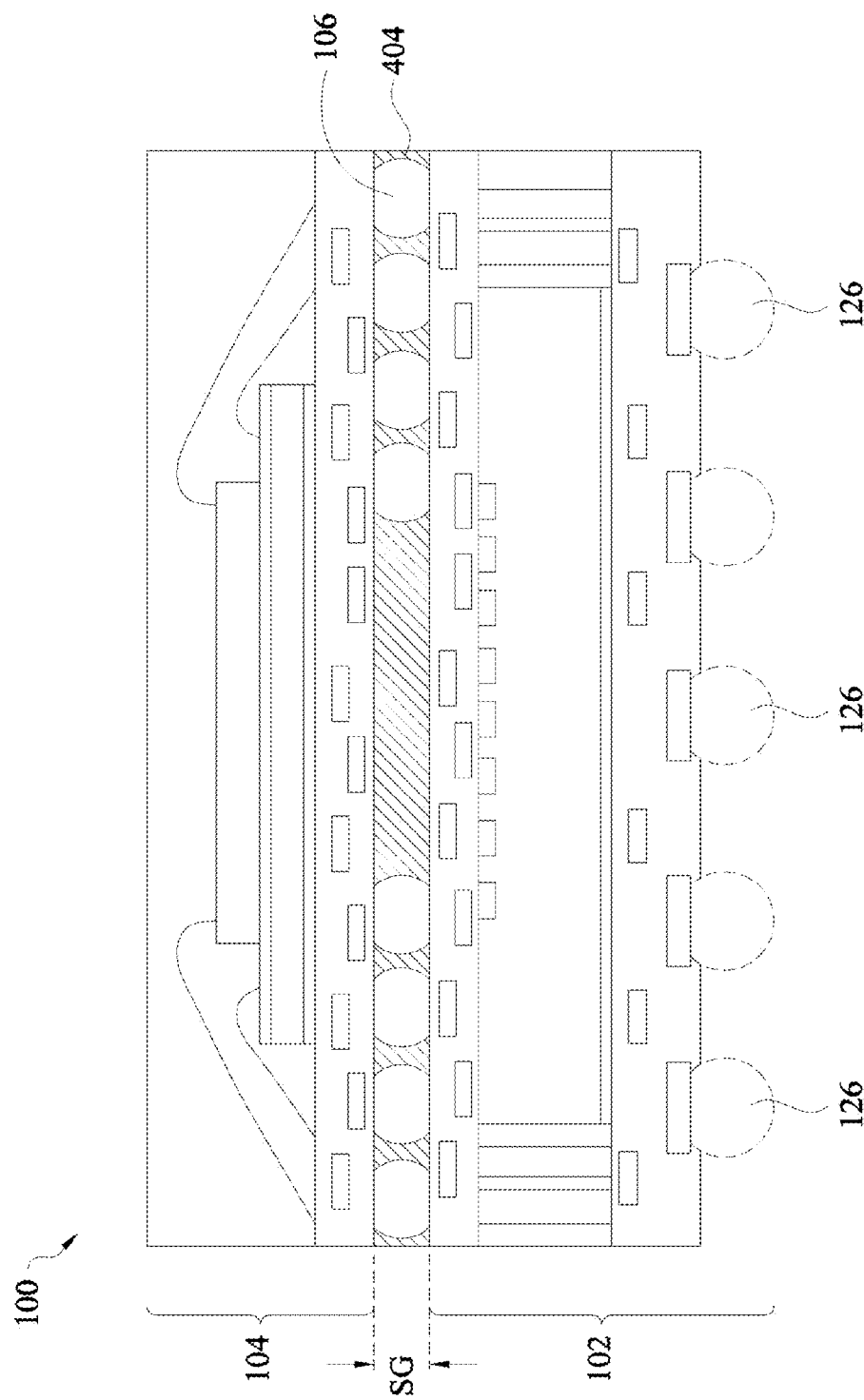

As shown in FIG. 4D, the underfill 404 may completely fill the standoff gap SG. In doing so, the first plurality of connectors 106 is encapsulated by the underfill 404 and the air gap G is filled with the underfill 404. However, in some embodiments (as in the example of FIG. 4E), a middle region of the standoff gap SG (e.g. the region of the standoff gap SG having the air gap G) may be free from the underfill 404, and the underfill 404 may encapsulate some of the first plurality of connectors 106. FIGS. 5A and 5B show a process flow illustrating a method of forming the package 100 shown in FIG. 4E.

As shown in FIG. 5A, the dispenser head 402 may be positioned over the standoff gap SG, and the underfill 404 may be dispensed or jetted or released from the dispenser head 402 over (e.g. directly over) the first plurality of connectors 106 proximate the first side S1 of the package 100. The underfill 404 may flow, under the influence of gravity, through the standoff gap SG from the first side S1 of the package 100 to the second side S2 of the package 100 opposite the first side S1. However, in the embodiment of FIG. 5A, the underfill 404 is prevented from flowing into the air gap G. For example, the underfill 404 flows through the standoff gap SG and encapsulates some of the first plurality of connectors 106 proximate the first side S1 of the package 100, and thereafter, the stage 300s of the movable support structure 300 is pivotably rotated such that the first side S1 of the package 100 is disposed lower on the surface 300a of the stage 300s than the second side S2 of the package 100. Such an arrangement is shown in FIG. 5B. In the example of FIG. 5B, the incline angle β is substantially equal to −90 degrees. The dispenser head 402 may be positioned over the standoff gap SG, and the underfill 404 may be dispensed or jetted or released from the dispenser head 402 over (e.g. directly over) the first plurality of connectors 106 proximate the second side S2 of the package 100. The underfill 404 may flow, under the influence of gravity, through the standoff gap SG from the second side S2 of the package 100 to the first side S1 of the package 100. However, as in the embodiment of FIG. 5A, the underfill 404 is prevented from flowing into the air gap G. For example, the underfill 404 flows through the standoff gap SG and encapsulates some of the first plurality of connectors 106 proximate the second side S2 of the package 100 and thereafter, the stage 300s of the movable support structure 300 may be returned to a position where the incline angle β is small (e.g. substantially zero). Subsequently, the package 100 may be removed from the movable support structure 300, and the resultant package 100 may resemble the package 100 shown in FIG. 4E.

Figure 4E:
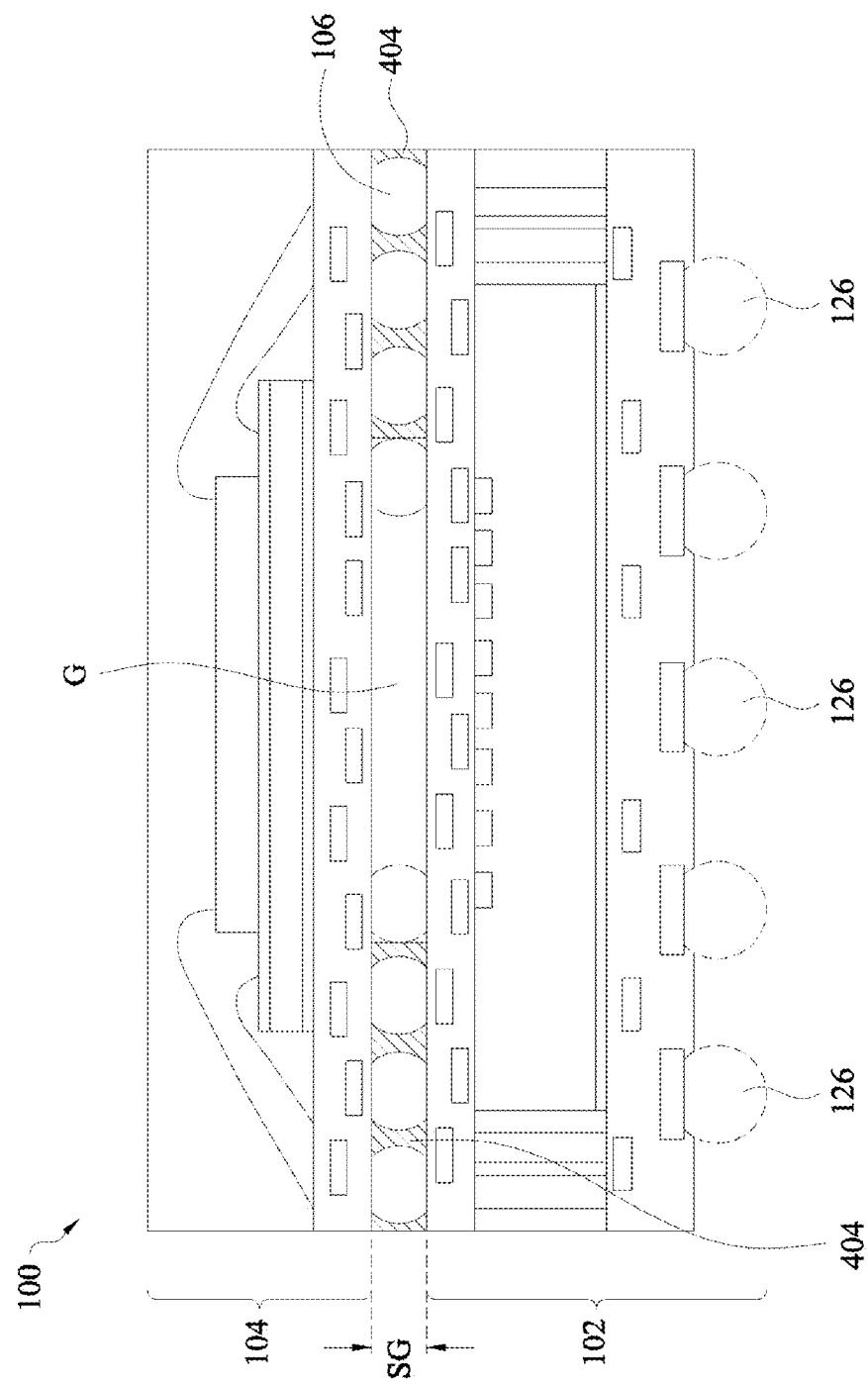
Figure 5A:
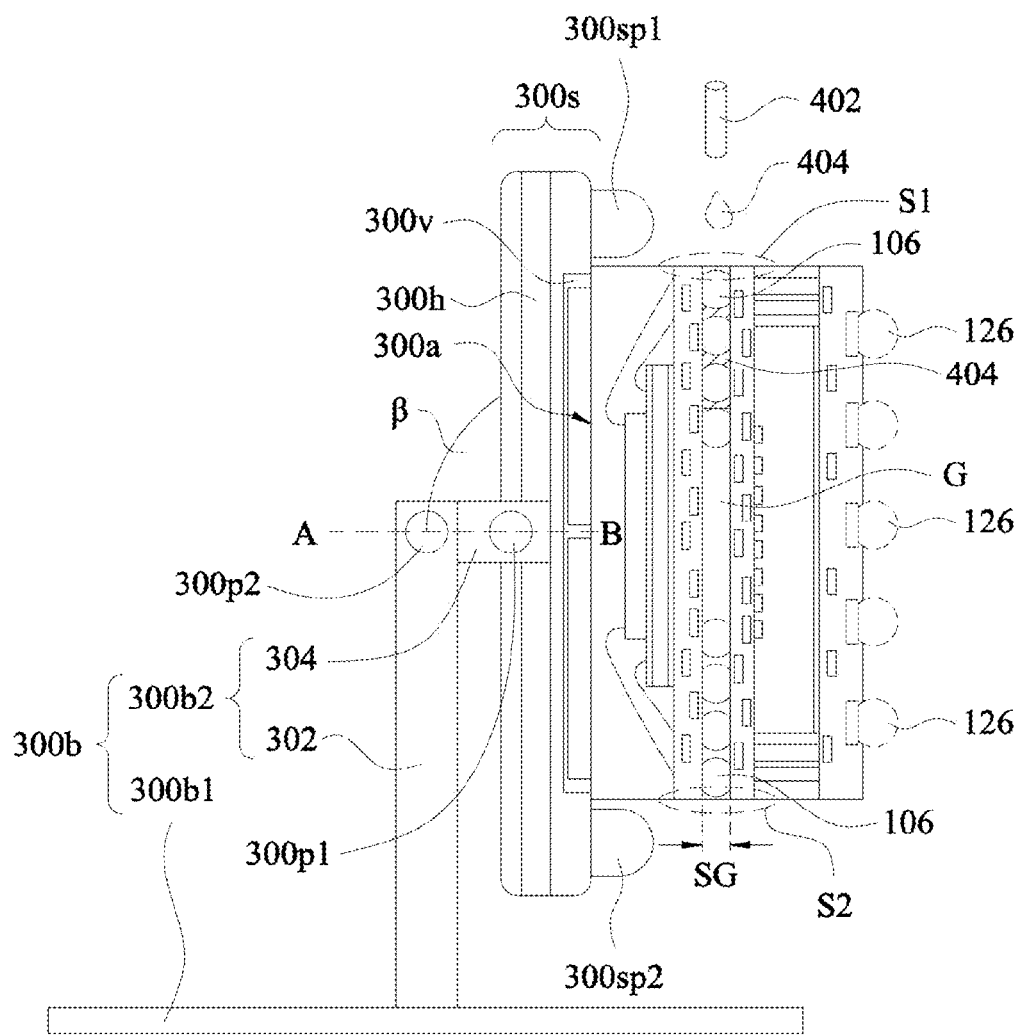
Figure 5B:
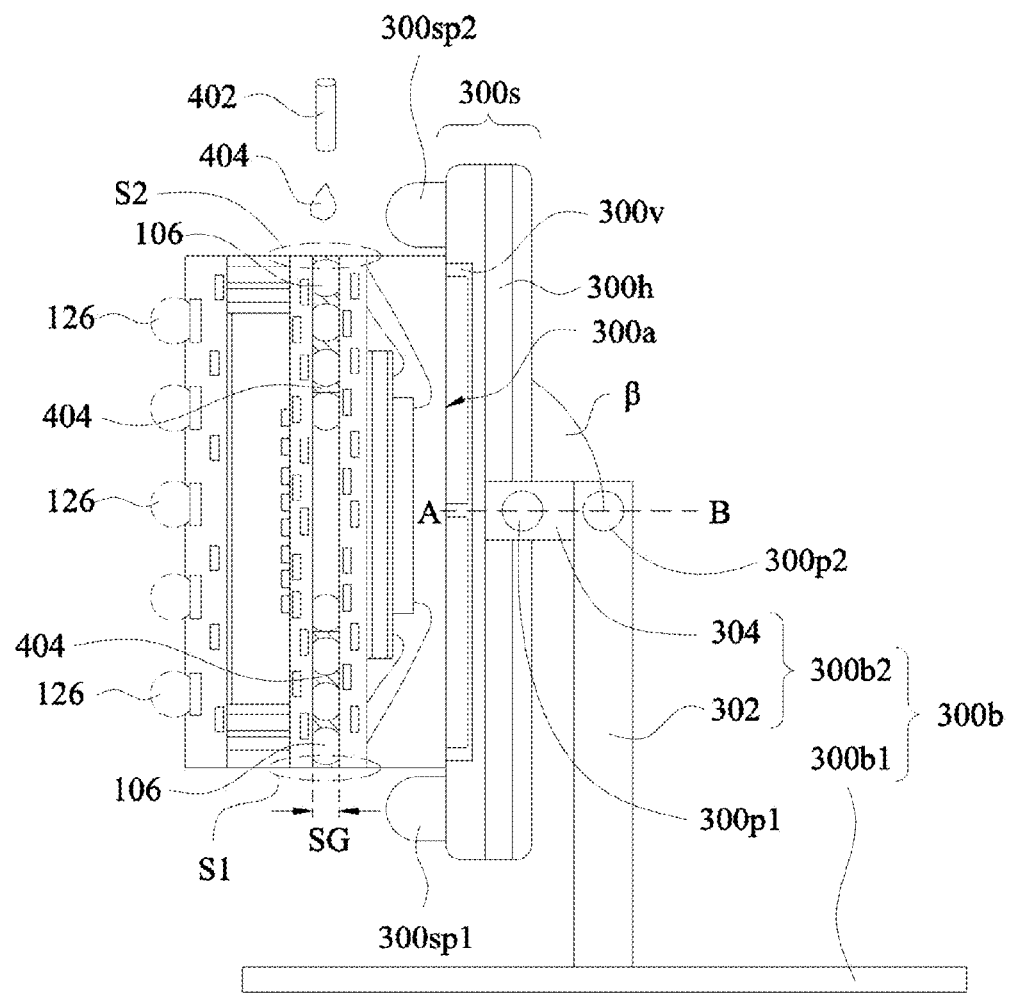
Figure 6A:
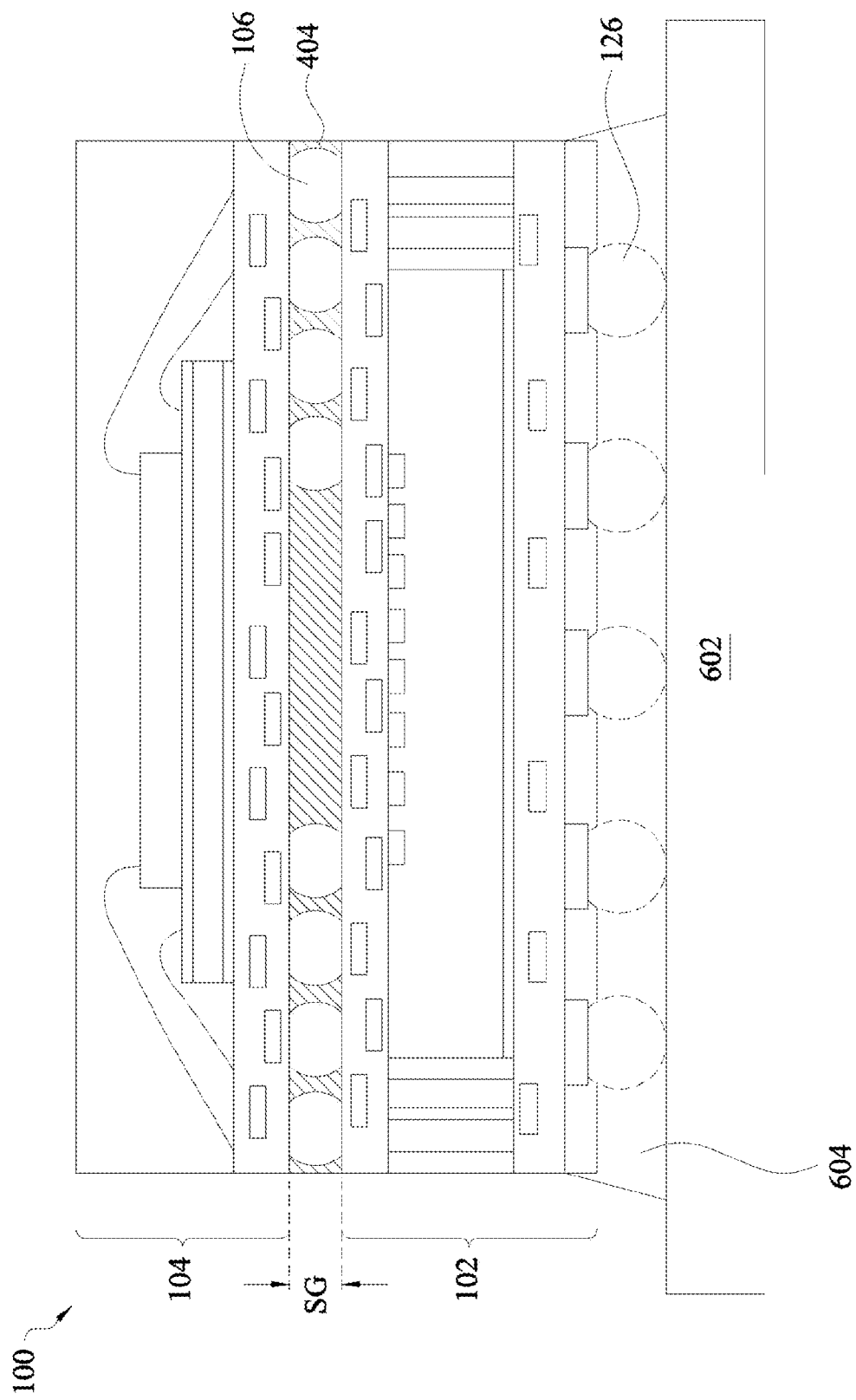
FIGS. 6A and 6B show package-on-package structures disposed over a substrate, in accordance with some embodiments.
Figure 6B:
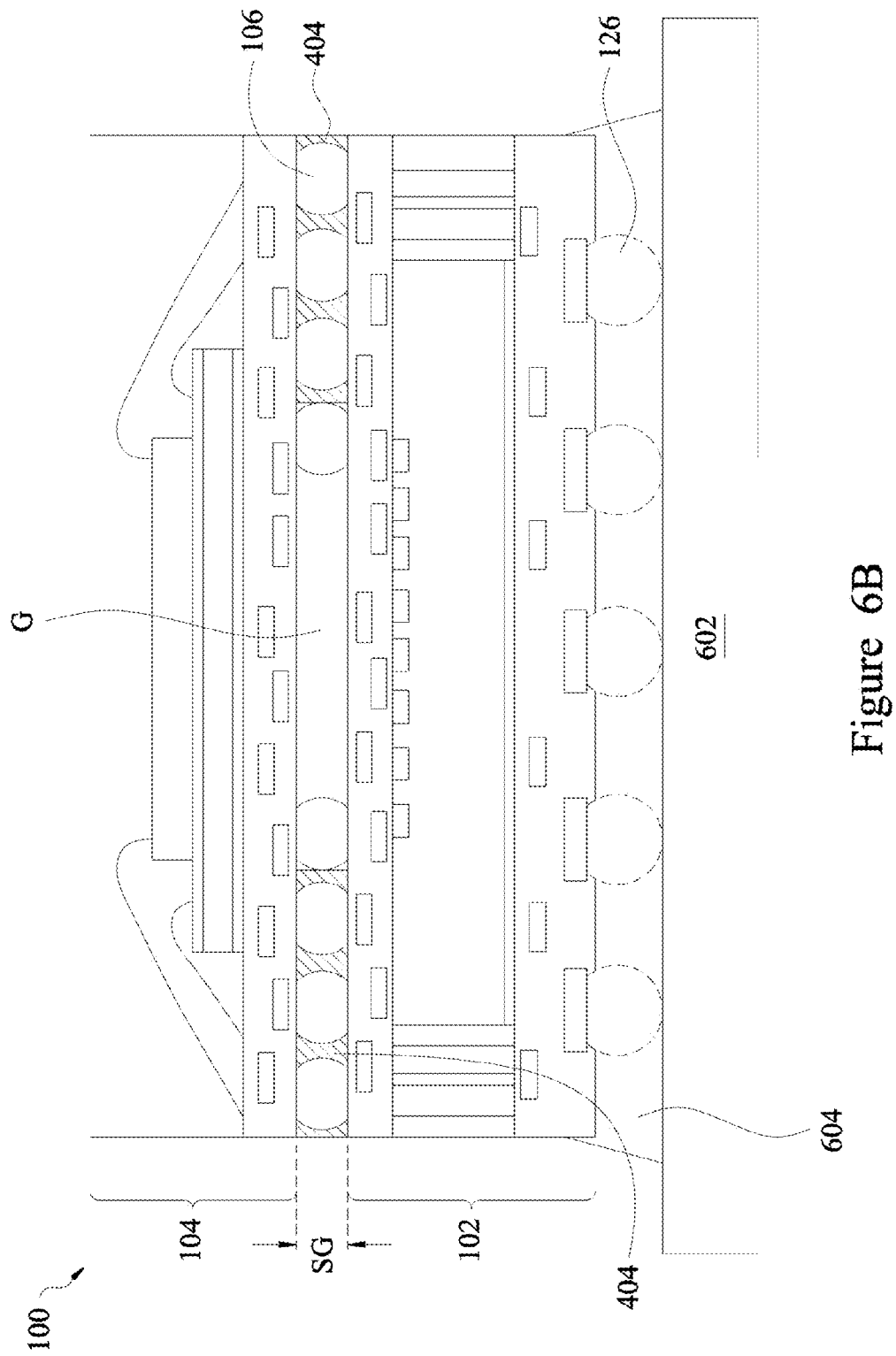

FIGS. 6A and 6B show some of the processing steps that may be performed on the packages 100 shown in FIG. 4D and FIG. 4E, respectively, after the underfill 404 is formed in the standoff gap SG. For example, the packages 100 may be bonded to a substrate 602, which may be a customer board, a printed circuit board, or an interposer board that may, for example, be used in an end-user application. Furthermore, a second underfill layer 604 (e.g. an underfill fillet) may be formed between the package 100 and the substrate 602. The second underfill layer 604 may at least partially encapsulate the second plurality of connectors 126 of the package 100. In an embodiment, different materials may be used for the underfill 404 and the second underfill layer 604. In other words, the underfill 404 and the second underfill layer 604 may differ in composition. Furthermore, as shown in FIGS. 6A and 6B, the underfill 404 and the second underfill layer 604 are separated (e.g. spatially or physically separated) from each other. Therefore, the reliability of the packages 100 may be improved since thermal and/or mechanical stresses that may affect the second underfill layer 604 may not affect the underfill 404, or vice versa, e.g. due to their physical separation.

Figure 7:
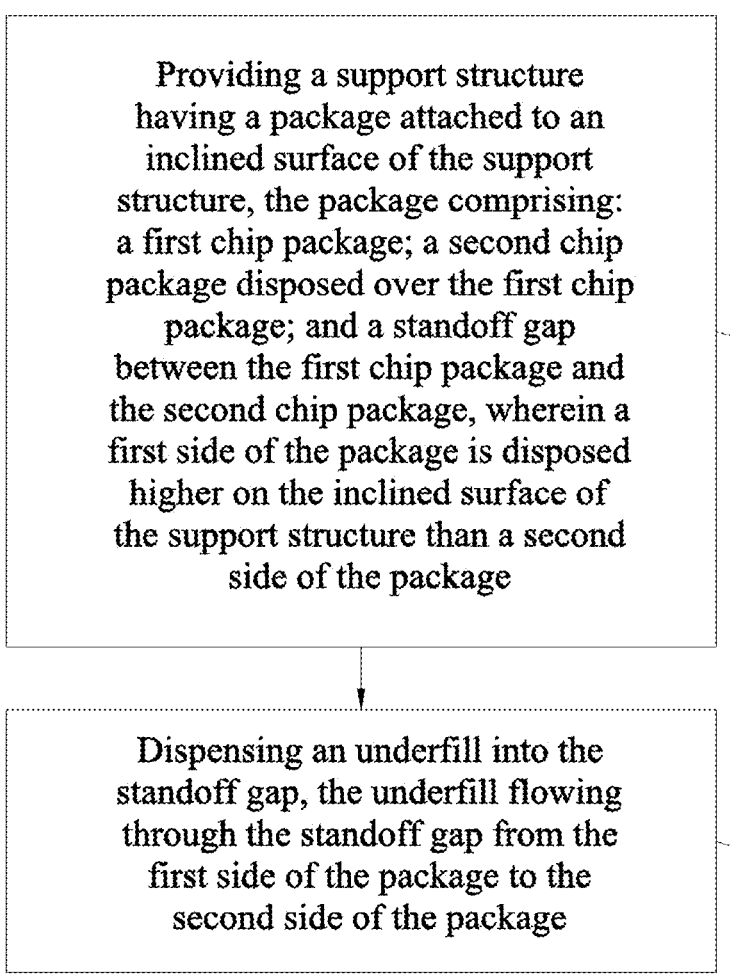
FIGS. 7 to 9 show methods of manufacturing a package-on-package structure, in accordance with some embodiments.

FIG. 7 shows a method 700 of manufacturing a package-on-package structure. The method 700 may, for example, be illustrated by the process flows shown in FIGS. 4A to 4E and FIGS. 5A and 5B. The method 700 may include: providing a support structure having a package attached to an inclined surface of the support structure, the package comprising: a first chip package; a second chip package disposed over the first chip package; and a standoff gap between the first chip package and the second chip package, wherein a first side of the package is disposed higher on the inclined surface of the support structure than a second side of the package (in 702); and dispensing an underfill into the standoff gap, the underfill flowing through the standoff gap from the first side of the package to the second side of the package (in 704).

Figure 8:
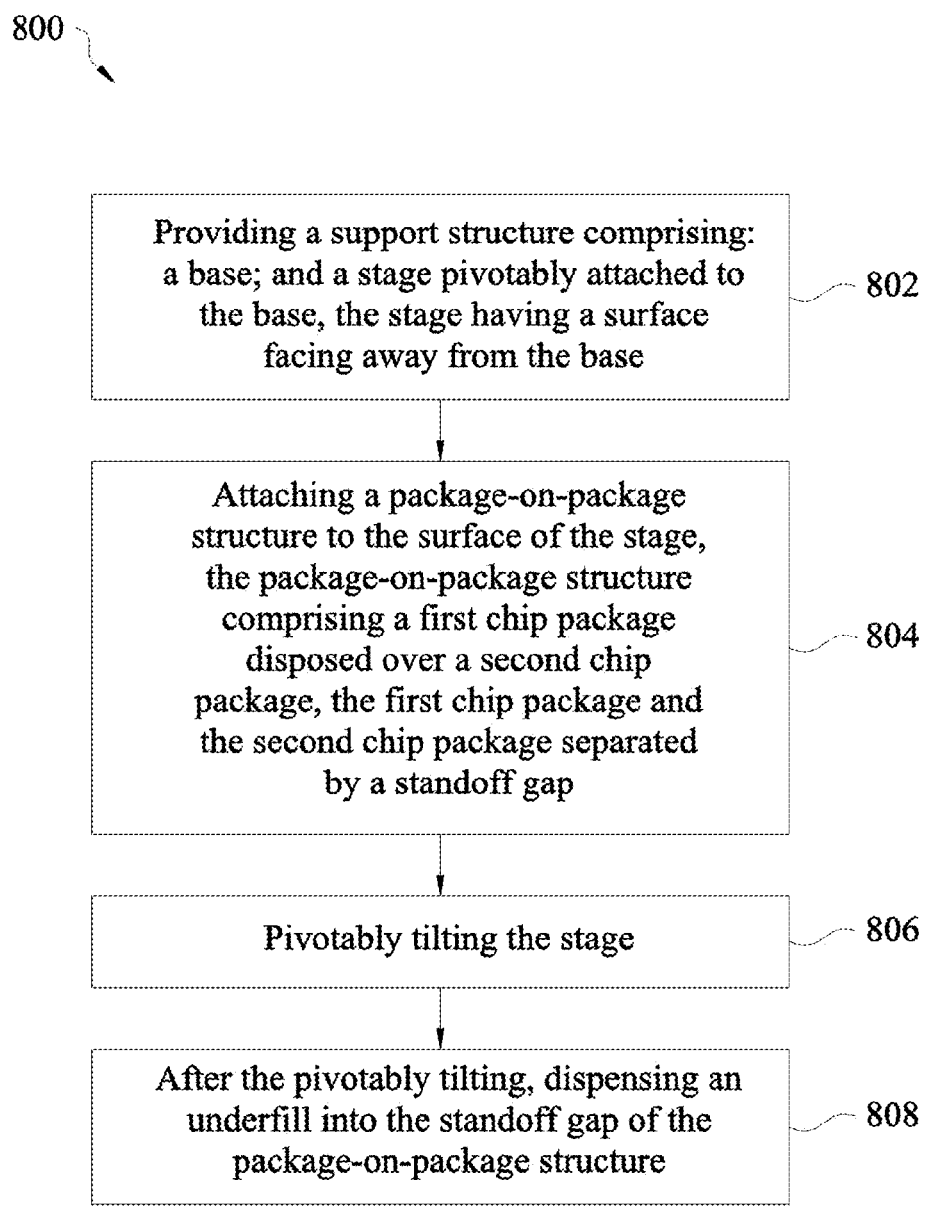

FIG. 8 shows a method 800 of manufacturing a package-on-package structure. The method 800 may, for example, be illustrated by the process flows shown in FIGS. 4A to 4E and FIGS. 5A and 5B. The method 800 may include: providing a support structure comprising: a base; and a stage pivotably attached to the base, the stage having a surface facing away from the base (in 802); attaching a package-on-package structure to the surface of the stage, the package-on-package structure comprising a first chip package disposed over a second chip package, the first chip package and the second chip package separated by a standoff gap (in 804); pivotably tilting the stage (in 806); and after the pivotably tilting, dispensing an underfill into the standoff gap of the package-on-package structure (in 808).

Figure 9:
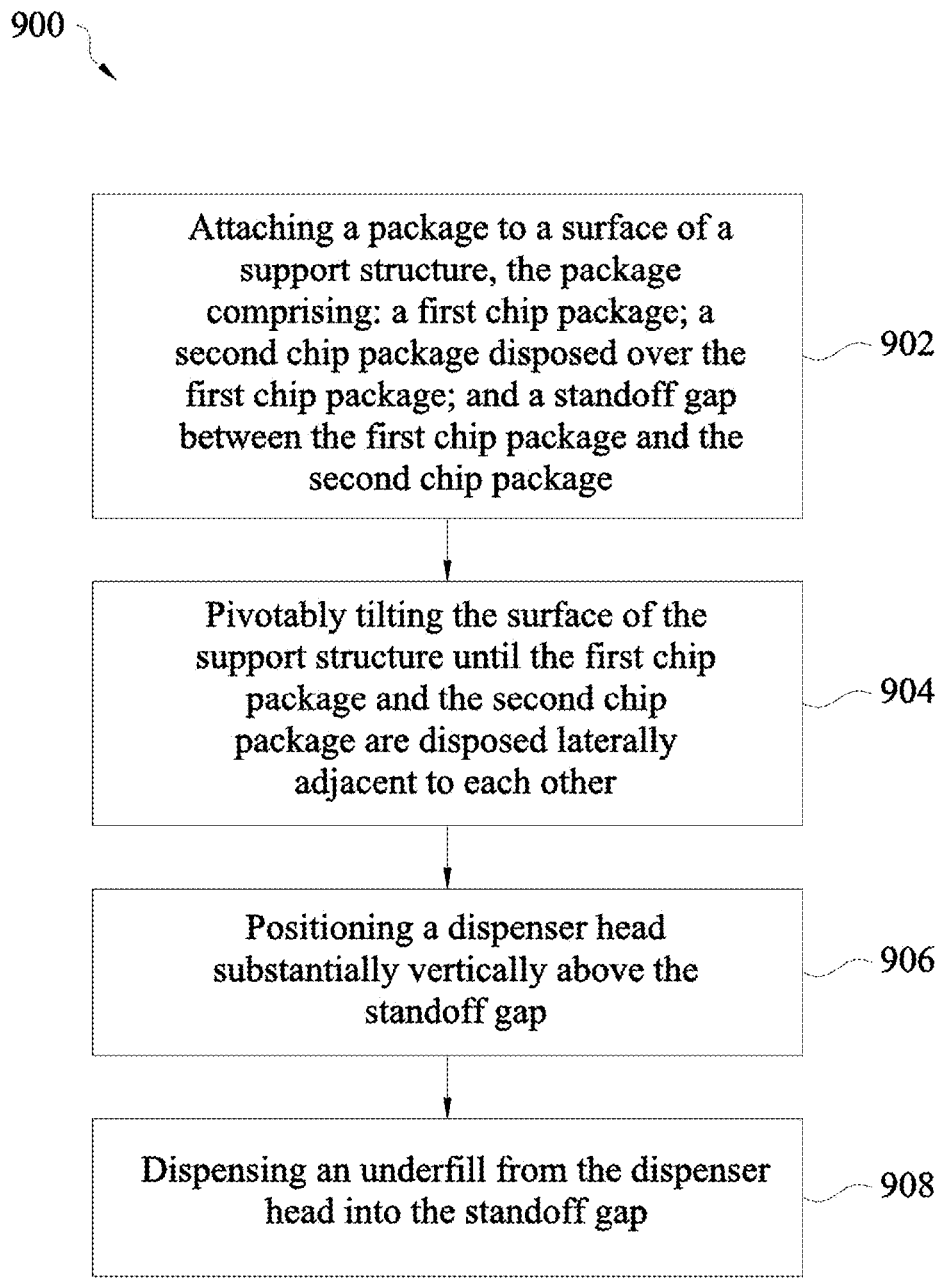

FIG. 9 shows a method 900 of manufacturing a package-on-package structure. The method 800 may, for example, be illustrated by the process flows shown in FIGS. 4A to 4E and FIGS. 5A and 5B. The method 900 may include: attaching a package to a surface of a support structure, the package comprising: a first chip package; a second chip package disposed over the first chip package; and a standoff gap between the first chip package and the second chip package (in 902); pivotably tilting the surface of the support structure until the first chip package and the second chip package are disposed laterally adjacent to each other (in 904); positioning a dispenser head substantially vertically above the standoff gap (in 906); and dispensing an underfill from the dispenser head into the standoff gap (in 908).

According to an embodiment presented herein, a method of manufacturing a package-on-package structure is provided. The method may include: providing a support structure having a package attached to an inclined surface of the support structure, the package comprising: a first chip package; a second chip package disposed over the first chip package; and a standoff gap between the first chip package and the second chip package, wherein a first side of the package is disposed higher on the inclined surface of the support structure than a second side of the package; and dispensing an underfill into the standoff gap, the underfill flowing through the standoff gap from the first side of the package to the second side of the package.

According to another embodiment presented herein, a method of manufacturing a package-on-package structure is provided. The method may include: providing a support structure comprising: a base; and a stage pivotably attached to the base, the stage having a surface facing away from the base; attaching a package-on-package structure to the surface of the stage, the package-on-package structure comprising a first chip package disposed over a second chip package, the first chip package and the second chip package separated by a standoff gap; pivotably tilting the stage; and after the pivotably tilting, dispensing an underfill into the standoff gap of the package-on-package structure.

According to yet another embodiment presented herein, a method of manufacturing a package-on-package structure is provided. The method may include: attaching a package to a surface of a support structure, the package comprising: a first chip package; a second chip package disposed over the first chip package; and a standoff gap between the first chip package and the second chip package; pivotably tilting the surface of the support structure until the first chip package and the second chip package are disposed laterally adjacent to each other; positioning a dispenser head substantially vertically above the standoff gap; and dispensing an underfill from the dispenser head into the standoff gap.

According to an embodiment presented herein, an apparatus is provided. The apparatus may include: a base; a stage adapted to support a semiconductor package; and an arm extending from the base to the stage, the arm pivotably connected to the stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a support structure having a package attached to an inclined surface of the support structure, the package comprising:
   a first chip package;
   a second chip package disposed over the first chip package; and
   a standoff gap between the first chip package and the second chip package, wherein a first side of the package is disposed higher on the inclined surface of the support structure than a second side of the package; and
   dispensing an underfill into the standoff gap, the underfill flowing through the standoff gap from the first side of the package to the second side of the package.

2. The method of claim 1, wherein the dispensing the underfill into the standoff gap comprises:
   positioning a dispenser head over the standoff gap at the first side of the package; and
   dispensing the underfill from the dispenser head into the standoff gap.

3. The method of claim 1, wherein the dispensing the underfill into the standoff gap comprises a jetting process.

4. The method of claim 1, further comprising:
   after the dispensing, placing the package over a substrate; and
   forming a second underfill layer in a space between the package and the substrate, the second underfill layer physically separated from the underfill in the standoff gap.

5. The method of claim 4, wherein the underfill and the second underfill layer differ in composition.

6. The method of claim 1, further comprising:
   heating the underfill by providing thermal energy, through the support structure, to the underfill.

7. The method of claim 1, wherein the providing the support structure having the package attached to the inclined surface of the support structure comprises:
   attaching the package to a surface of the support structure; and
   pivotably tilting the surface of the support structure to form the inclined surface of the support structure having the package attached thereto.

8. The method of claim 7, wherein the attaching the package to the surface of the support structure comprises:
   placing the package on the surface of the support structure; and
   securing the package to the surface of the support structure by a suction force delivered through the support structure.

9. The method of claim 1, wherein an angle subtended by the inclined surface of the support structure relative to a horizontal axis is substantially 90 degrees.

10. A method, comprising:
    providing a support structure comprising:
    a base; and
    a stage pivotably attached to the base, the stage having a surface facing away from the base;
    attaching a package-on-package structure to the surface of the stage, the package-on-package structure comprising a first chip package disposed over a second chip package, the first chip package and the second chip package separated by a standoff gap;
    pivotably tilting the stage; and
    after the pivotably tilting, dispensing an underfill into the standoff gap of the package-on-package structure.

11. The method of claim 10, wherein the pivotably tilting the stage comprises rotating the stage using a motor mechanically connected to the stage.

12. The method of claim 10, wherein the pivotably tilting the stage comprises rotating the stage until an angle subtended by the stage relative to a horizontal axis is in a range from about 15 degrees to about 90 degrees or in a range from about −15 degrees to about −90 degrees.

13. The method of claim 10, wherein a width of the first chip package is substantially equal to a width of the second chip package.

14. The method of claim 10, wherein the standoff gap is in a range from about 100 micrometers to about 300 micrometers.

15. The method of claim 10, wherein the dispensing the underfill into the standoff gap of the package-on-package structure comprises:
positioning a dispenser head vertically above the standoff gap; and
jetting the underfill from the dispenser head into the standoff gap.

16. A method, comprising:
attaching a package structure to a rotatable support surface positioned at a first angle, the package structure comprising a first semiconductor package attached to a second semiconductor package, wherein the first semiconductor package is separated from the second semiconductor package by a standoff gap;
rotating the rotatable support surface about an axis parallel to the rotatable support surface to a second angle;
dispensing an underfill material into a first end of the standoff gap;
rotating the rotatable support surface about the axis to a third angle; and
dispensing the underfill material into a second end of the standoff gap, the second end opposite the first end.

17. The method of claim 16, wherein the rotatable support surface is rotated from the second angle to a fourth angle as the underfill material is flowing within the standoff gap.

18. The method of claim 16, wherein the second angle is about 90 degrees from the first angle.

19. The method of claim 16, wherein the third angle is about 180 degrees from the second angle.

20. The method of claim 16, further comprising heating the rotatable support surface.

* * * * *